United States Patent [19]
Gardner et al.

[11] Patent Number: 5,882,974
[45] Date of Patent: Mar. 16, 1999

[54] HIGH-PERFORMANCE PMOS TRANSISTOR USING A BARRIER IMPLANT IN THE SOURCE-SIDE OF THE TRANSISTOR CHANNEL

[75] Inventors: Mark I. Gardner, Cedar Creek; H. Jim Fulford, Jr., Austin, both of Tex.

[73] Assignee: Advanced Micro Devices, Inc.

[21] Appl. No.: 57,251

[22] Filed: Apr. 8, 1998

[51] Int. Cl.$^6$ ........................ H01L 21/336; H01L 21/425
[52] U.S. Cl. ........................ 438/286; 438/305; 438/528
[58] Field of Search .................................. 438/528, 286, 438/158, 305

[56] References Cited

U.S. PATENT DOCUMENTS

| | | |
|---|---|---|
| 4,523,213 | 6/1985 | Konaka et al. . |
| 4,683,637 | 8/1987 | Varker et al. . |
| 4,700,454 | 10/1987 | Baerg et al. . |
| 5,567,629 | 10/1996 | Kubo . |
| 5,712,173 | 1/1998 | Liu et al. . |
| 5,759,897 | 6/1998 | Kadosh et al. . |

OTHER PUBLICATIONS

H. Shibata et al., *IEDM Tech. Dig.*, 1987, pp. 590–593.
J.M. Hwang et al, "High Performance Submicron SOI/CMOS With An Elevated Source/drain Structure", *IEEE International SOI Conference Proceedings*, 1993, pp. 132–133.
J.H. Lee et al., "Recessed Channel (RC) SOI NMOSFETs With Self–Aligned Polysilicon Gate Formed on the Region", *IEEE International SOI Conference Proceedings*, 1996, pp. 122–123.

*Primary Examiner*—Richard A. Booth
*Attorney, Agent, or Firm*—Kevin L. Daffer; Conley, Rose & Tayon

[57] ABSTRACT

The present invention advantageously provides a method for forming a transistor having decreased source-side parasitic resistance and an improved shallow junction, thereby providing for enhanced transistor performance and improved resistance to short-channel effects. Barrier atoms are selectively implanted into the semiconductor substrate prior to formation of lightly doped drains and source/drain regions. Barrier atoms present in the channel region under the gate structure prevent migration of the lightly doped drain implant impurities into the channel region, thus reducing parasitic resistance. Barrier atoms implanted into the junction region prevent migration of source implant impurities more deeply into the junction region, thus preserving the shallow junction.

12 Claims, 3 Drawing Sheets

HIGH-PERFORMANCE PMOS TRANSISTOR USING A BARRIER IMPLANT IN THE SOURCE-SIDE OF THE TRANSISTOR CHANNEL

BACKGROUND OF THE INVENTION

1. Field of the Invention

This invention relates to integrated circuit fabrication and, more particularly, to forming a p-channel transistor having a barrier implant in the source-side of the channel to control migration of subsequently introduced, high diffusivity implant species therein.

2. Description of the Related Art

Associated with fabrication of PMOSFETs are several difficulties not found in NMOSFET fabrication. Among these is the problem of redistribution of implanted boron used to form source/drain areas in a PMOSFET. Dopants with relatively heavy ionic masses, such as arsenic, are implanted to form source/drain implant areas in NMOSFETs. These heavy ions have relatively small projected implant ranges and little channeling when implanted. Further, arsenic has a low diffusivity, such that minimal redistribution occurs as a result of post-implant annealing.

In contrast, boron has a relatively low atomic mass. As a result, junctions formed using boron are deeper than junctions formed with heavier n-type impurities. Due to its lower mass, boron has a longer implant range, even at lower implant energies. Ion channeling by boron also increases the depth of the implant. In addition, boron has a high diffusivity. Post-implant anneal can cause significant redistribution of boron, leading to both a deeper junction due to vertical redistribution and a narrowed channel due to lateral redistribution. The presence of boron adjacent to and even within the channel adds capacitance and resistance to the source/drain pathway. This added resistance, generally known as parasitic resistance, can have many deleterious effects. For example, parasitic resistance can decrease the saturation drive current and the overall speed of the transistor. Thus, in order to maximize drive current, it is desirable to maintain separation between the source impurity distribution and the channel.

While it would seem beneficial to decrease the drain-side parasitic resistance as well as the source-side parasitic resistance, the drain-side parasitic resistance is nonetheless needed to minimize the problem of hot carrier injection ("HCI") as the lateral dimensions of PMOSFETs decrease to the submicron range. HCI is a phenomenon whereby the kinetic energy of the charge carriers (holes or electrons) is increased as the carriers are accelerated through large potential gradients and subsequently become trapped within the gate dielectric. The greatest potential gradient, often referred to as the maximum electric field ("$E_m$"), occurs near the drain during saturated operation of a transistor. More specifically, the electric field is predominant at the lateral junction of the drain adjacent the channel. As hot carriers travel to the drain, they lose their energy by a process called impact ionization. Impact ionization serves to generate electron-hole pairs which migrate to and become injected within the gate dielectric near the drain junction. Vacancy and interstitial positions within the gate dielectric generally become electron traps, resulting in a net negative charge density within the gate dielectric. Unfortunately, the trapped charge may accumulate over time, causing the transistor threshold voltage to undesirably shift from its design specification.

To overcome the problems related to HCI, an alternative drain structure known as the lightly doped drain ("LDD") has grown in popularity. The LDD structure advantageously absorbs some of the potential into the drain and thus reduces $E_m$. A conventional LDD structure is one in which a light concentration of dopant is self-aligned to the gate conductor followed by a heavier concentration of dopant self-aligned to the gate conductor on which two sidewall spacers have been formed. The purpose of the first implant dose is to produce a lightly doped section (i.e., an LDD area) at the gate edge immediately adjacent the channel. The second implant dose forms a heavily doped source/drain region spaced from the channel a distance dictated by the thickness of the sidewall spacer. A dopant gradient (i.e., graded junction) therefore results at the interface between the LDD area and the channel as well as between the LDD area and the source/drain region. Lightly doped drain areas are typically formed simultaneously on both the source and drain sides to facilitate processing. Because the addition of an LDD implant adjacent the channel adds capacitance and resistance to the source/drain pathway, however, transistor fabrication often involves a compromise between maximizing drive current and minimizing hot carrier injection.

Further, as the dimensions of transistor features have become increasingly smaller to provide for faster and more complex integrated circuit devices, the shrinkage of device dimensions has given rise to various problems. Microelectronic manufacturers have primarily focused on reducing the lateral dimensions of transistor devices to achieve the desired operational speed of an integrated circuit. After implantation of dopants into the source/drain regions and subsequent diffusion of the dopants, the actual distance between the source/drain regions becomes less than the physical channel length and is often referred to as the effective channel length ("$L_{eff}$"). In VLSI designs, as the physical channel length becomes small, so too must $L_{eff}$. Decreasing $L_{eff}$ of a transistor generally leads to so-called short-channel effects ("SCE") in which the transistor's properties, e.g., the transistor threshold voltage, undesirably vary from their design specification. Absent a comparable reduction in the depth of the source/drain regions, the severity of the SCE resulting from a decrease in $L_{eff}$ may be profound. Accordingly, it has become necessary to scale down the vertical dimensions of the source/drain regions, (i.e., the depth of the implant), to ensure proper operation of transistor devices.

The formation of shallow source/drain regions (i.e., junctions) is, however, rather difficult for PMOSFET devices which include boron-implanted junctions. Due to the relatively high diffasivity and channeling of boron atoms, implanted boron can penetrate deeply into the substrate. While using very low implant energies of boron might produce relatively shallow junctions, advances in technology are required to make available low-energy ion implanters before such low implant energies can be realized. Reducing the junction depth has residual value in decreasing lateral diffusion as well. Thus, a low energy implant can provides some protection against SCE. However, a shallow implant, or an implant with low dosage, can increase the parasitic resistance of the source/drain junctions. Moreover, forming contacts to relatively shallow junctions has several drawbacks. A contact layer which consumes the underlying source/drain junctions is often used during contact formation. For example, a refractory metal may be deposited across the source/drain junctions and heated to initiate a reaction between the metal and the underlying silicon, thereby forming a low resistivity self-aligned silicide ("salicide") upon the junctions. Unwanted junction spiking may also occur if aluminum contacts abut the relatively shallow junctions. Consequently, the junctions may exhibit large current leakage or become electrically shorted. Therefore, precautions must be taken to prevent excessive consumption of the shallow junctions (i.e., junction spiking) during contact formation.

Attempts have been made to overcome the problems associated with junction depth reduction. One approach involves using selective silicon growth ("SSG") with rapid thermal anneal ("RTA") processing, as described in "High Performance Half-Micron PMOSFETs With 0.1 $\mu$m Shallow P$^+$N Junction Utilizing Selective Silicon Growth And Rapid Thermal Annealing", H. Shibata et al., *IEDM Tech. Dig.*, 1987, pp. 590–593 (incorporated by reference as if fully set forth herein). The SSG technique is used to raise the source/drain regions above the base of an adjacent gate conductor by growing silicon selectively upon the source/drain regions. After the SSG process, RTA of the source/drain regions is performed to minimize impurity redistribution and to reduce the source/drain resistance as well as the contact resistance. However, the SSG technique, which uses selective epitaxial growth, is generally difficult to control and requires equipment typically not used by integrated circuit manufacturers. Both of these factors contribute to the high overall cost of using the SSG technique.

Another approach used to prevent the shortcomings of shallow junctions is described in "High Performance Submicron SOI/CMOS With An Elevated Source/drain Structure", J. M. Hwang et al., *IEEE International SOI Conference Proceedings*, 1993, pp. 132–133 (incorporated by reference as if fully set forth herein). This approach employs thinning of the channel. The extent of thinning may unfortunately fluctuate across the channel region, depending upon the physical channel length. Accordingly, it may be difficult to achieve the depth of the resulting recessed region required to reduce the source/drain resistance of the ensuing source/drain regions which are to be raised above the base of the ensuing gate conductor. A gate conductor which is not self-aligned to the recessed region of the substrate may be undesirably patterned above the substrate. As a result, a portion of the gate conductor may extend below the uppermost surface of the substrate into the recess region, while another portion of the gate conductor may terminate above the substrate surface beyond the recess region. A transistor formed in this manner may exhibit characteristics dissimilar from those designed for the transistor.

A process similar to the one above is described in "Recessed Channel (RC) SOI NMOSFETs With Self-Aligned Polysilicon Gate Formed on the RC Region", J. H. Lee et al., *IEEE International SOI Conference Proceedings*, 1996, pp. 122–123 (incorporated by reference as if fully set forth herein). Lee et al. generally describe a masking layer which exposes only the channel region of a substrate. During local oxidation of the channel region, oxide growth may occur underneath the edges of the masking layer in addition to upon the channel region, a phenomena known as the "bird's beak" effect. Due to the bird's beak effect, the resulting sidewall surfaces of the gate conductor may be nonvertical. As a result, the physical channel length might not be clearly defined. Further, the relatively low slope of the gate conductor sidewall surfaces may severely limit, if not eliminate, the possibility of forming dielectric sidewall spacers upon the sidewall surfaces. Therefore, the ability to form well-defined LDD areas adjacent to the gate conductor may be sacrificed by the formation of the gate conductor above a recessed region of the substrate.

It would therefore be of benefit to develop a transistor fabrication method which permits forming a transistor having maximal drive current and minimal hot carrier injection. Further, it would be beneficial to develop a method for forming a transistor with relatively shallow source/drain junctions. A transistor fabricated according to such a process would exhibit improved performance (e.g., speed). In addition, such a transistor would be less likely to experience short channel effects even if the transistor possesses a relatively short physical channel length. The transistor would also be more likely to operate according to design.

SUMMARY OF THE INVENTION

The problems identified above are in large part addressed by a semiconductor fabrication process in which barrier atoms are implanted into a semiconductor substrate prior to the formation of lightly doped drain regions and source/drain regions. The incorporation of barrier atoms into the junction region facilitates formation of a shallow junction by inhibiting migration of the barrier atoms into deeper junction regions during annealing of the impurity implant. In addition, the incorporation of barrier atoms into the channel region may substantially reduce the migration of impurity dopants from the lightly doped drain into the channel, thus minimizing source-side parasitic resistance and maximizing drive current. Transistors so formed may exhibit enhanced performance and increased reliability.

Broadly speaking, the invention contemplates a semiconductor fabrication process in which a gate dielectric is formed on an upper surface of a semiconductor substrate. The substrate includes an active region; the active region includes a channel region that is laterally disposed between a pair of source/drain regions. In an embodiment, the active region may be laterally disposed between a pair of isolation structures. After the formation of the gate dielectric, a conductive gate structure is formed on the upper surface of the semiconductor substrate. The conductive gate is aligned over the channel region of the substrate.

Preferably, the semiconductor substrate is a single crystal silicon wafer in which a p-type epitaxial layer having a sheet resistivity preferably in the range of approximately 10–15 $\Omega$-cm is formed over a p+ silicon bulk. The formation of the gate dielectric is preferably accomplished by thermally oxidizing an upper surface of the semiconductor substrate at a temperature in the range of approximately 500°–900° C. The formation of the conductive gate structure is accomplished in a presently preferred embodiment by depositing polysilicon on an upper surface of the gate dielectric. The preferred polysilicon deposition process includes thermally decomposing silane in a chemical-vapor deposition reactor chamber maintained at a temperature in the range of approximately 580°–650°. A photoresist film is then deposited on the polysilicon and photolithographically patterned to produce a patterned photoresist film that includes a photoresist structure that is aligned over the channel region of the semiconductor substrate. A plasma etch is then performed to remove exposed portions of the polysilicon film.

Following formation of the gate structure, a barrier distribution is introduced into the semiconductor substrate. In a PMOS embodiment, a masking structure may be formed over the drain-side junction region and a portion of the gate structure adjacent the drain side to block barrier atom implantation in the masked regions. Preferably, the masking structure covers about one-half the lateral dimension of the gate structure. The implant masking structure suitably comprises photoresist patterned using conventional photolithography/photoresist techniques. The barrier implant suitably includes any chemically and electrically inert species. In a preferred embodiment, the barrier implant includes a nitrogen-containing species.

During implantation, the gate structure serves as a partial mask such that barrier atoms implanted into the junction region have a peak impurity concentration at a first depth beneath the surface of the semiconductor substrate and such that barrier atoms implanted into the channel region have a peak impurity concentration at a second depth less than the first depth. In a preferred embodiment, the peak impurity concentration in the channel region is located slightly below the upper surface of the semiconductor substrate. Following formation of the barrier regions, the implant masking structure is removed.

The introduction of the source/drain impurity distribution in one embodiment includes implanting a lightly doped impurity distribution into the semiconductor substrate using the conductive gate structure as an implant mask so that the lightly doped impurity distribution is aligned with the sidewalls of the conductive gate structure. Spacer structures are then formed on the sidewalls to mask portions of the source/drain regions that are proximal to the channel region. A heavily doped impurity distribution is then implanted into the semiconductor substrate. The presence of the conductive gate structure and the spacer structures during the implanting of the heavily doped impurity distribution ensures that the boundaries of the heavily doped impurity distribution within the semiconductor substrate are laterally displaced from respective boundaries of the channel region. The spacer structures are typically formed by depositing a conformal dielectric layer on a topography defined by the semiconductor substrate and the conductive gate structure of the dielectric layer above planar regions of the topography. These planar regions are defined as regions substantially parallel with the upper surface of the semiconductor substrate. The deposition of the conformal dielectric layer is suitably accomplished by decomposing TEOS in a chemical vapor deposition reactor chamber maintained at a temperature in the range of approximately 650°–750° C. at a pressure of less than approximately 2 torr. In one embodiment, the present invention further includes removing the dielectric layer from portions of the semiconductor substrate upper surface disposed above the source/drain regions and depositing a siliciding metal on a topography comprising the semiconductor substrate, the conductive gate structure and the spacer structures. The semiconductor substrate is then heated to react the metal with the source/drain regions and the conductive gate structure to form silicide regions within the source/drain region and within the conductive gate structure. The sheet resistivity of the silicide thereby formed is less than the corresponding sheet resistance of the non-silicided source/drain regions or non-silicided conductive gate structure.

The present invention further contemplates an integrated circuit transistor. The transistor includes a semiconductor substrate which has an active region laterally disposed between a pair of isolation structures. The active region includes a channel region laterally disposed between a pair of source/drain regions. The transistor includes a gate dielectric formed on an upper surface of the semiconductor substrate aligned over the channel region of the substrate. A conductive gate structure resides on an upper surface of the gate dielectric. The conductive gate structure includes sidewalls on which a pair of spacer structures are formed. The spacer structures mask peripheral portions of the source/drain regions proximal to the channel region of the semiconductor substrate. The transistor further includes lightly doped drain impurity distributions and source/drain impurity distributions within the pair of source/drain regions. The transistor further includes silicide structures located on upper regions of the pair of source/drain regions and on an upper surface of the conductive gate structure.

The semiconductor substrate further include a barrier distribution implanted in at least a portion thereof. In a PMOS embodiment, the barrier distribution resides in the source-side junction region and at least a portion of the source-side channel region. The barrier distribution substantially inhibits the migration of mobile impurities within the source-side lightly doped drain regions from traveling into and through the channel region of the semiconductor substrate. The barrier distribution further inhibits the migration of mobile impurities within the source region from migrating farther into the semiconductor substrate, thus preserving a shallow junction formation.

BRIEF DESCRIPTION OF THE DRAWINGS

Other objects and advantages of the invention will become apparent upon reading the following detailed description and upon reference to the accompanying drawings in which.

Figure 1:
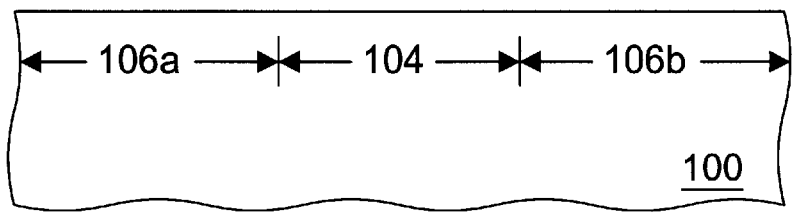
FIG. 1 is a partial cross-sectional view of a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a semiconductor substrate 100 including a channel region 104 laterally displaced between source and drain regions 106a and 106b. Semiconductor substrate 100 preferably comprises a single crystal silicon wafer such as are well known in the field of semiconductor processing. In one embodiment, semiconductor substrate 100 includes a p+ silicon bulk upon which a p-type epitaxial layer has been formed. A preferred resistivity of the p-type epitaxial layer is in the range of approximately 10–15 Ω-cm. Prior to the processing steps shown in FIGS. 1–9, n-type wells and p-type wells may be formed in the p+ silicon bulk where formation of PMOS transistors and NMOS transistors, respectively, is desired. In an embodiment, isolation structures (not shown) may be formed in semiconductor substrate 100. Isolation structures may include, for example, shallow trench isolation structures or LOCOS isolation structures.

Figure 2:
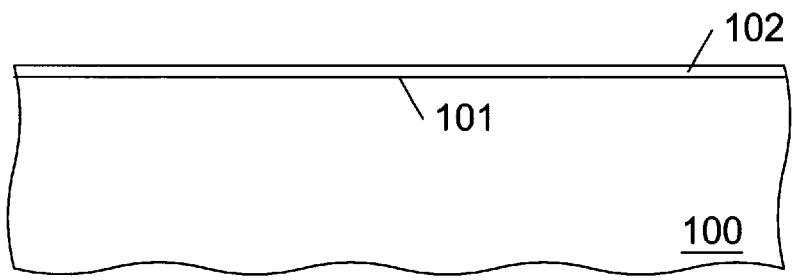
FIG. 2 depicts a processing step subsequent to FIG. 1 in which a gate dielectric is formed on the semiconductor substrate.

Turning to FIG. 2, a dielectric layer 102 is formed on upper surface 101 of semiconductor substrate 100. In a preferred embodiment, dielectric layer 102 comprises a thermally grown silicon dioxide film. Gate dielectric 102 is preferably fabricated by immersing semiconductor substrate 100 into an oxidation chamber which includes an oxygen-bearing ambient maintained at a temperature in the range of approximately 500°–900° C. In an embodiment, a thickness of gate dielectric 102 over channel region 104 of semiconductor substrate 100 is in the range of approximately 15–100 angstroms.

Figure 3:
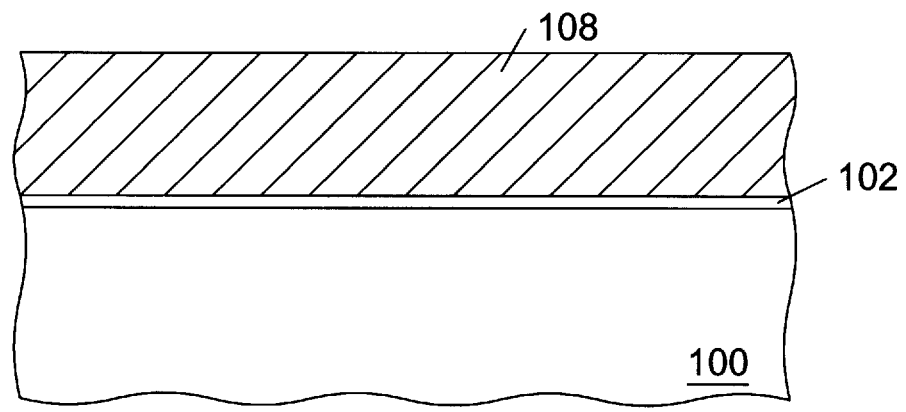
FIG. 3 depicts a processing step subsequent to FIG. 2 in which a conductive gate layer is deposited on the gate dielectric layer.

Turning now to FIG. 3, a conductive gate layer 108 is formed upon an upper surface of gate dielectric layer 102. In an embodiment, conductive gate layer 108 comprises heavily doped polysilicon. In a preferred process for forming gate dielectric layer 108, silane is thermally decomposed in a chemical deposition reactor chamber maintained at a temperature in the range of approximately 580°–650° C. To obtain a suitable resistivity of the polysilicon layer, an impurity is typically introduced into conductive layer 108 either in situ (i.e., during the deposition of the film) or subsequent to the deposition with the use of an ion implantation process or a diffusion process. For purposes of this disclosure, a heavily doped polysilicon refers to a polysilicon having a sheet resistivity less than approximately 500 Ω/square. In an alternative embodiment useful in fabrication processes in which it is possible to maintain a maximum temperature of less than approximately 500° C. subsequent to the deposition of conductive gate layer 108, conductive gate layer 108 may be comprised of a metal such as aluminum, copper, tungsten or an appropriate alloy thereof.

Figure 4:
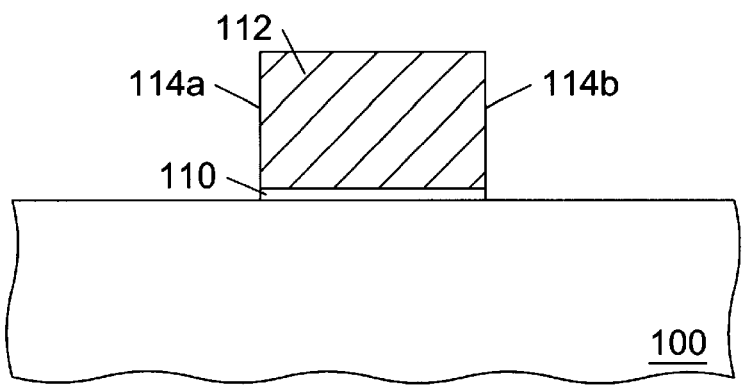
FIG. 4 depicts a processing step subsequent to FIG. 4 in which the conductive gate layer is patterned to form a conductive gate structure aligned over a channel region of the semiconductor substrate.

Turning now to FIG. 4, conductive gate structure 112 is fabricated from conductive gate layer 108. Conductive gate structure 112 includes a pair of sidewalls 114a and 114b that are laterally aligned over boundary regions of channel region 104 of semiconductor substrate 100. Thus, it will be appreciated that conductive gate structure 112 is aligned over channel region 104 of semiconductor substrate 100. A suitable process for forming conductive gate structure 112 from conductive gate layer 108 includes a conventional photolithography process in which a photoresist film is deposited over the conductive gate layer 108. The photoresist film is then photolithographically patterned to produce a patterned photoresist film which includes a photoresist structure aligned over the channel region 104 of semiconductor substrate 100. The exposed portions of conductive gate layer 108 are then removed with a conventional plasma etch process which is well known in the field of semiconductor processing. The patterned photoresist film is then removed from the semiconductor substrate with a photoresist strip process. As depicted in FIG. 4, portions of gate dielectric 102 may be removed to form gate dielectric structure 110 simultaneously with conductive gate structure 112. Alternatively, portions of gate dielectric structure 102 may be removed in a subsequent processing step.

Figure 5:
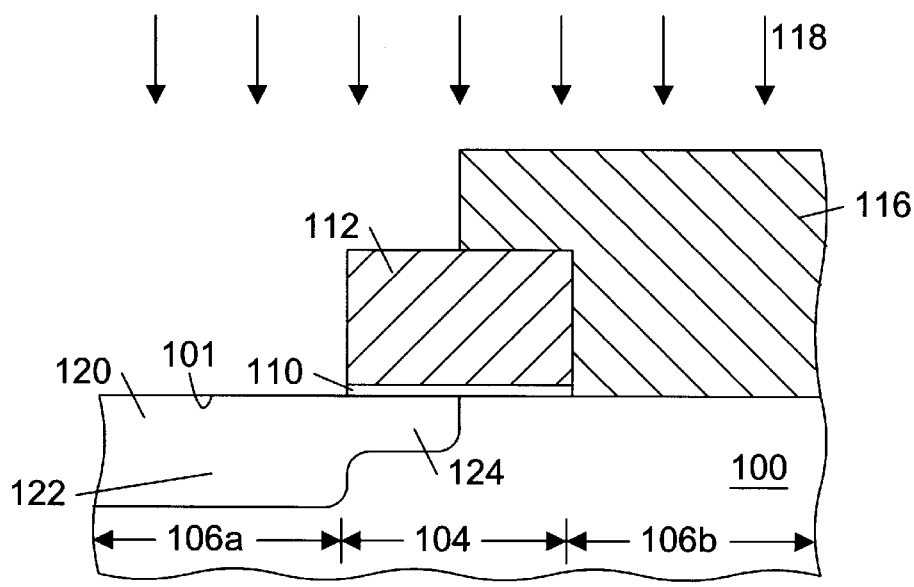
FIG. 5 depicts a processing step subsequent to FIG. 4 in which a barrier impurity distribution is introduced into the conductive gate layer.

Turning now to FIG. 5, masking structure 116 is formed to mask region 106b of semiconductor substrate 100. In a PMOS embodiment, region 106b is the drain side. Masking structure 116 covers a portion of gate conductor 112 as well; preferably, masking structure 116 covers about one-half the lateral dimension of gate conductor 112. Masking structure 116 suitably comprises photoresist patterned using conventional photolithography/photoresist techniques.

Following formation of masking structure 116, a barrier distribution is introduced into regions of semiconductor substrate 100 not covered by the masking structure. Ion implant 118 is used to form barrier region 120. Barrier region 120 includes junction barrier region 122 and channel barrier region 124. Ion implant 118 suitably includes any electrically and chemically inert species. In a preferred embodiment, ion implant 118 comprises nitrogen. Junction barrier region 122 is formed injunction region 106a and has a peak impurity concentration at a first depth below upper surface 101 of semiconductor substrate 100. Gate conductor 112 and gate dielectric 110 partially mask ions implanted into channel region 104 such that channel barrier region 124 has a peak impurity concentration at a second depth less than the first depth below upper surface 101 of semiconductor substrate 100. Preferably, the peak impurity concentration of channel barrier region 124 occurs slightly below upper surface 101. Preferably, the introduction of a nitrogen-bearing species into semiconductor substrate 100, which is represented in FIG. 5 by reference numeral 118, is accomplished by using an implant species selected from the group of appropriate nitrogen species including $N_2O$, NO, and $N_2$, and N.

Figure 6:
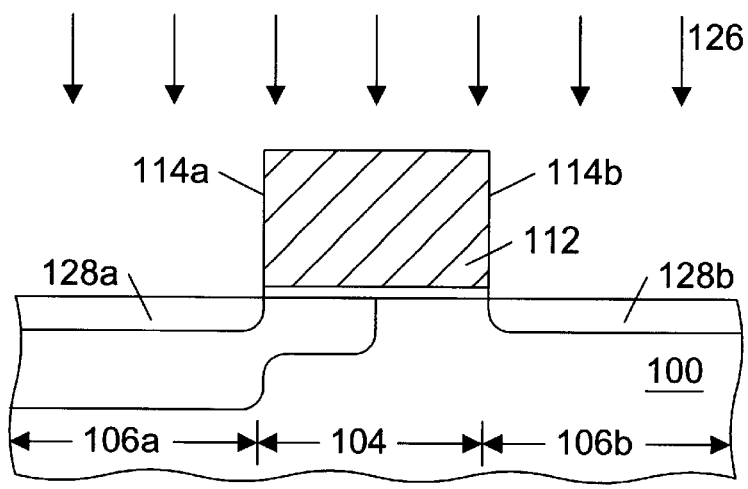
FIG. 6 depicts a processing step subsequent to FIG. 5 in which a lightly doped drain impurity distribution is introduced into the semiconductor substrate.

Turning now to FIG. 6, the introduction of a source/drain impurity distribution into the source and drain regions of semiconductor substrate 100 is accomplished by implanting a lightly doped impurity distribution, represented by reference numerals 128a and 128b, into semiconductor substrate 100. The presence of conductive gate structure 112 during lightly doped implant 126 serves to align lightly doped impurity distributions 126 with respective sidewalls 114 of conductive gate structure 112. In this manner, it will be appreciated that lightly doped impurity distributions 128 extend laterally to positions approximately coincident with respective boundaries of channel region 104. Suitable implant species used to accomplish the formation of lightly doped impurity distribution 128 include, for a PMOS transistor, boron or boron difluoride.

Figure 7:
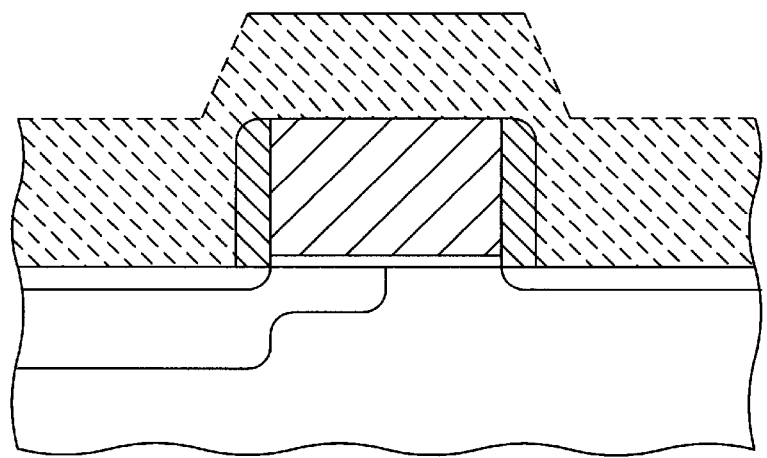
FIG. 7 depicts a processing step subsequent to FIG. 6 in which spacer structures are formed on sidewalls of the conductive gate structure.
Figure 8:
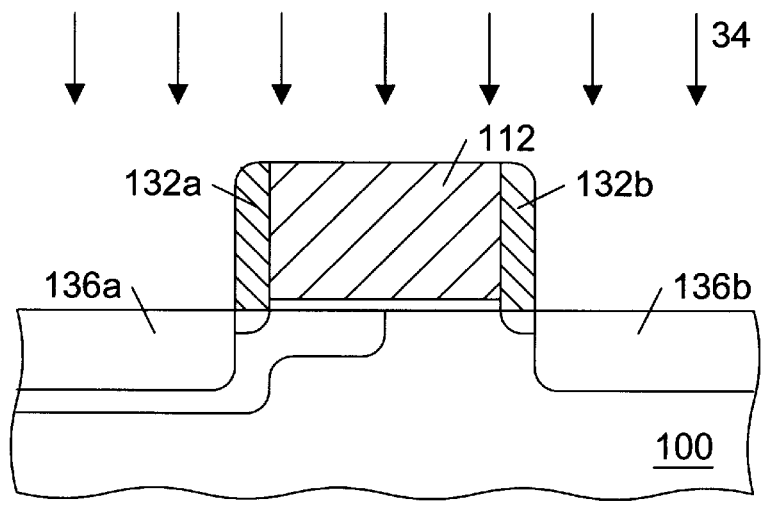
FIG. 8 depicts a processing step subsequent to FIG. 7 in which a source/drain impurity distribution is introduced into the semiconductor substrate.

Turning now to FIG. 7, a conformal dielectric layer 130 (shown in phantom) has been deposited across conductive gate structure 112 and semiconductor substrate 100 to form a pair of spacer structures 132a and 132b adjacent the sidewalls of conductive gate structure 112. The deposition of the conformal dielectric layer is preferably accomplished by decomposing TEOS in a chemical vapor deposition reactor chamber that is maintained at a temperature in the range of approximately 650°–750° C. and pressure of less than approximately 2 torr. For purposes of this disclosure, a conformal dielectric layer refers to a dielectric layer which has a thickness that varies less than approximately 20% across the semiconductor substrate topography.

Subsequent to the deposition of the conformal dielectric layer, a plasma etch process is used to remove portions of the dielectric layer from substantially horizontal surfaces of semiconductor substrate 100 and conductive gate structure 112 while leaving behind the portions of the dielectric layer adjacent to vertical regions of the gate structure. In addition to providing a blocking structure for a subsequent implant, spacer structures are useful in silicide processes because they provide a region upon which a subsequently deposited metal will not react thereby preventing short circuits between the source and drain terminals of a transistor with the gate terminals as will be described in greater detail below.

Spacer structures such as spacer structures 132a and 132b facilitate the formation of a graded junction contemplated by the lightly doped drain process. More specifically, the presence of spacer structures 132a and 132b (as well as the presence of conductive gate structure 112) results in a lateral displacement of the resulting impurity distribution away from the boundaries of channel region 104 within semiconductor substrate 100. This lateral displacement of the source/drain impurity distribution 136a and 136b is a desirable method for achieving the reduction in electric field within channel region 104. The heavily doped impurity distribution 136 is ideally introduced into semiconductor substrate 100 with the use of an implantation process represented in FIG. 8 by reference numeral 134. In a PMOS embodiment, implant 134 is accomplished using an implant species of boron.

Figure 9:
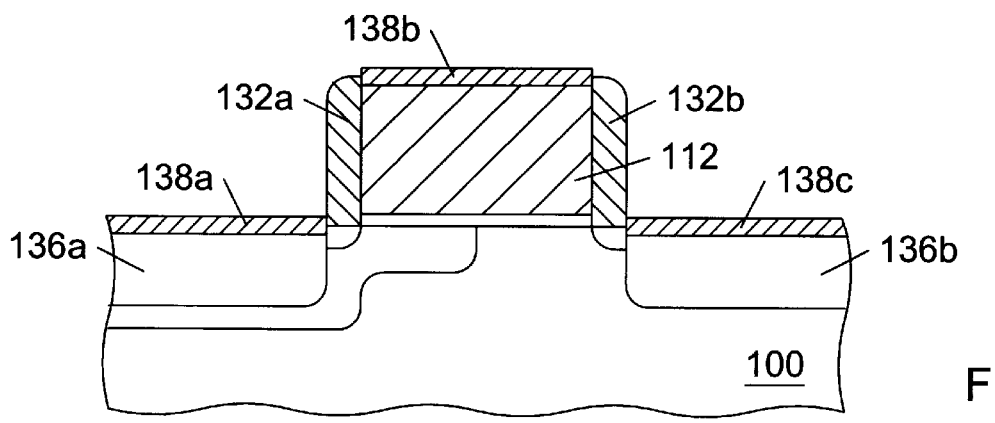
FIG. 9 depicts a processing step subsequent to FIG. 8 in which metal silicide structures are formed on upper portions of the source/drain areas and the gate conductor.

Turning now to FIG. 9, silicide structures 140a, 140b, and 140c are formed at upper surfaces of source/drain impurity distribution 136a and 136b and conductive gate structure 112. A refractory metal layer such as titanium or cobalt is deposited upon semiconductor substrate 100 and source/drain regions 136 and immersed in a heated ambient to a temperature in the range of approximately 400°–800° C. until portions of the refractory metal layer in contact with underlying silicon react with the underlying silicon to form a silicide. As will be appreciated to those skilled in the art, heating the metal to the indicated temperature in the presence of single crystal silicon or polysilicon results in a reaction between the metal layer and the underlying silicon in which a silicide is formed. Where the metal layer is in contact with a dielectric such as spacer structures 132 or isolation structures, the metal will not react. The silicide material provides a low resistivity material to which a subsequently formed interconnect may be connected thereby reducing the contact resistance of the integrated circuit.

It will be appreciated to those skilled in the art that the present invention contemplates a method of fabricating a semiconductor transistor that facilitates the formation of shallow source/drain structures and improves the resistance of the transistor to penetration by mobile impurities including boron. Various modifications and changes may be made to each and every processing step as would be obvious to a person skilled in the art having the benefit of this disclosure. For example, the barrier impurity distribution may extend the entire length of the semiconductor topography. Alternatively, the barrier impurity distribution may be formed exclusively in the channel region or exclusively in one or both of the junction regions. It is intended that the following claims be interpreted to embrace all such modifications and changes and, accordingly, the specification and drawings are to be regarded in an illustrative rather than a restrictive sense.

What is claimed is:

1. A method for forming a transistor comprising:

providing a gate conductor dielectrically spaced over a channel area between a source region and a drain region;

implanting a plurality of barrier atoms substantially through only a portion of the gate conductor exclusively into the channel area immediately adjacent the source region while concurrently implanting the plurality of barrier atoms into the source region; and implanting a plurality of dopant atoms into the source region and drain region.

2. The method of claim 1, wherein implanting barrier atoms comprises:

patterning a masking layer to leave the source region exposed and only said portion of the gate conductor immediately adjacent the source region exposed; and introducing the plurality of barrier atoms into the exposed source region and the partially exposed gate conductor.

3. The method of claim 2, wherein said introducing comprises injecting the plurality of barrier atoms to a greater depth within said source region than said channel area.

4. The method of claim 2, wherein patterning the masking layer comprises:

depositing a masking material across the entirety of said source region, said drain region and said gate conductor; and removing the masking material from said source region and from said gate conductor parallel to an axis along which the gate conductor extends.

5. The method of claim 2, wherein said introducing comprises injecting the plurality of barrier atoms to a peak concentration density within the source region deeper than a peak concentration density within the channel area.

6. The method of claim 2, wherein implanting the plurality of barrier atoms comprises implanting atomic species that are chemically and electrically inert to electrical stimuli placed thereon.

7. The method of claim 1, wherein implanting the plurality of dopant atoms comprises implanting boron atomic species.

8. The method of claim 1, wherein implanting the plurality of barrier atoms comprises implanting chemical species that contain nitrogen.

9. The method of claim 1, wherein implanting the plurality of dopant atoms comprises implanting a material selected from the group consisting of boron and boron difluoride.

10. The method of claim 1, wherein implanting the plurality of barrier atoms comprises implanting chemical species selected from the group consisting of N, $N_2$, NO, and $N_2O$.

11. The method of claim 1, wherein implanting the plurality of dopant atoms comprises:

implanting p-type atomic species into the source and drain regions;

forming a pair of spacers adjacent opposed sidewall surfaces of the gate conductor; and implanting p-type atomic species into the source and drain regions laterally spaced from the channel area by the pair of spacers.

12. The method of claim 11, wherein forming the pair of spacers comprises chemical-vapor depositing a material selected from the group consisting of silicon dioxide, silicon nitride, and silicon oxynitride; and anisotropically removing the material except from the opposed sidewall surfaces.

* * * * *